(12) United States Patent
Ouyang

(10) Patent No.: US 7,839,634 B2
(45) Date of Patent: Nov. 23, 2010

(54) MICRO THRUST COOLING

(76) Inventor: Chien Ouyang, 843 Humewick Way, Sunnyvale, CA (US) 94087

( * ) Notice: Subject to any disclaimer, the term of this patent is extended or adjusted under 35 U.S.C. 154(b) by 13 days.

(21) Appl. No.: 12/229,364

(22) Filed: Aug. 22, 2008

(65) Prior Publication Data
US 2009/0052137 A1 Feb. 26, 2009

Related U.S. Application Data

(60) Provisional application No. 60/965,736, filed on Aug. 22, 2007.

(51) Int. Cl.
H05K 7/20 (2006.01)
(52) U.S. Cl. .................. 361/691; 361/679.47; 361/689; 361/694; 361/709; 361/710; 165/104.33; 165/104.34; 165/109.1; 165/124
(58) Field of Classification Search ............ 361/679.46, 361/679.5, 690–697, 230, 231, 226, 233, 361/330; 165/80.3, 104.21, 104.33, 109.1, 165/121, 125; 417/48, 49, 50; 315/111, 315/111.21, 111.31, 111.91; 96/18–26, 63, 96/80–82; 95/78, 2–8, 79–81
See application file for complete search history.

(56) References Cited

U.S. PATENT DOCUMENTS

| 6,522,536 | B2* | 2/2003 | Brewer et al. | 361/679.47 |
|---|---|---|---|---|
| 7,190,587 | B2* | 3/2007 | Kim et al. | 361/704 |
| 7,236,344 | B2* | 6/2007 | McCullough | 361/231 |
| 7,269,008 | B2* | 9/2007 | Mongia et al. | 361/689 |
| 7,545,640 | B2* | 6/2009 | Fisher et al. | 361/694 |
| 7,607,470 | B2* | 10/2009 | Glezer et al. | 165/121 |
| 7,661,468 | B2* | 2/2010 | Schlitz | 165/121 |
| 2002/0126448 | A1* | 9/2002 | Brewer et al. | 361/687 |
| 2005/0007726 | A1* | 1/2005 | Schlitz et al. | 361/330 |
| 2006/0005946 | A1* | 1/2006 | Borgstrom et al. | 165/96 |
| 2006/0169441 | A1* | 8/2006 | Schlitz | 165/121 |
| 2007/0171593 | A1* | 7/2007 | DuBose | 361/225 |
| 2008/0060794 | A1* | 3/2008 | Wei | 165/109.1 |

* cited by examiner

Primary Examiner—Michael V Datskovskiy
(74) Attorney, Agent, or Firm—Bo-In Lin

(57) ABSTRACT

One embodiment of the present invention uses plasma-driven gas flow to cool down electronic devices. The cooling device may comprise micro heat sink fins assembly, micro plasma actuators assembly, and magnetic circuit assembly. The plasma actuator assembly comprises electrodes and dielectric pieces. Voltages are applied to electrodes to drive the plasma gas flow. A magnetic circuit assembly may be used to provide the magnetic field to couple with plasma actuators to induce the plasma gas flow to cool down the heat sink fins and heat source.

20 Claims, 7 Drawing Sheets

MICRO THRUST COOLING

CROSS REFERENCE TO RELATED APPLICATIONS

This is a Non-Provisional Patent Application and claims the Priority Date of a pending U.S. Provisional Patent Application No. 60/965,736 filed on Aug. 22, 2007 by a same Applicant of this Non-Provisional Patent Application. The disclosures made in the Provisional Patent Application 60/965,736 are hereby incorporated by reference in this Non-Provisional Patent Application.

BACKGROUND OF THE INVENTION

1. Field of the Invention

The present invention relates generally to electronic equipment, and more particularly, to apparatus and methods for cooling electronic devices using micro thrust plasma-driven gas flow.

2. Description of the Related Art

Electronic devices may generate significant heat during operation. High temperatures may reduce the lifespan of these devices, and, therefore, the generated heat may need to be dispersed to keep the operating temperature of the electronic devices within acceptable limits.

One commonly used cooling device is heat sink. Heat sinks may be coupled to electronic devices to absorb heat through the heat sink base and disperse the heat through their fins. Conventional methods to disperse the heat through the heat sink fins are natural convection and forced convection. Natural convection is to disperse the heat away from the surfaces of heat sink fins without the aid of external forced fluid pumping through heat sink fins. On the other hand, the forced convection cooling is to pump the fluid to flow through heat sink fins, such as the fans to blow the air through the heat sink fins, and therefore enhance the heat transfer between fins and outside ambient.

With the increasing power density of electronic devices, the pitch or the distance between heat sink fins is becoming smaller, which means more surface area may be used to transport the heat away. However, when the pitch becomes very small, the pressure drop between inlet and outlet of the heat sink fins may become very high, which may results the difficulties to pump the fluid flowing through fins, and as a result, more powerful fans, which consume higher electricity may be needed for the cooling. The invention utilizes plasma-driven gas flow to conduct the convective heat transfer along the heat sink fins and therefore will resolve these issues.

Another consideration of the electronic device cooling is that, due to size concern, the internal space allowed to put cooling fans and other cooling components, may be limited or not permitted. The invention utilizes the plasma-driven gas flow to generate the forced convective heat transfer on the heat sink fins, and hence, is able to improve the heat transfer efficiency and to minimize the required space because some cooling components are assembled inside heat sink fins.

Another aspect of using the invention is to lower the required power of the system fans of electronic devices. The plasma driven gas flow on the heat sink fins will induce the local turbulence on the heat sink surfaces. Higher momentum of the fluid is obtained and the cooling is achieved. Therefore, in this way, the system fan doesn't need to be very powerful in order to cool down heat source.

Plasma-driven gas flow has been used either to cool articles or to control and modify the fluid dynamics boundary layer on the wings surfaces of the aerodynamic vehicles. For example, U.S. Pat. No. 3,938,345 used the phenomenon of corona discharge, which is one type of plasma, to do the local cooling of an article. U.S. Pat. No. 4,210,847 designed an apparatus for generating an air jet for cooling application. U.S. Pat. No. 5,554,344 had a gas ionization device to do the cooling of zone producing chamber. U.S. Pat. No. 6,796,532 B2 used a plasma discharge to manipulate the boundary layer and the angular locations of its separation points in cross flow planes to control the symmetry or asymmetry of the vortex pattern.

However, none of the above patents are coupled to the heat sink, which is a fundamental apparatus for cooling electronic devices. Hence, what are needed are a method and an apparatus, to couple with heat sink fins to cool down electronic devices efficiently.

SUMMARY OF THE INVENTION

One embodiment of the present invention provides a plasma-driven cooling device couple to heat sink fins to induce the gas flow along the heat sink fins. The induced gas flow will remove the heat away from heat sink fin surface and therefore the heat source is cool down.

In one embodiment, the plasma-driven cooling device includes heat sink fins assembly, magnetic circuit assembly, and plasma actuator assembly. The heat sink fin assembly includes a plurality of heat sink fins. The magnetic circuit assembly includes ferromagnetic yokes and permanent magnets. The plasma actuator assembly includes electrodes and dielectric layers.

In one embodiment, the micro plasma actuators may contain one or many pairs of the electrodes and the there is a passage going through electrodes. In another embodiment, the shape of the electrode may be square, circular or other shapes.

In one embodiment, the plasma actuators may contain electrodes on the two sides of the dielectric layer, and the actuators may couple with a magnetic field to induce the plasma flow to cool down the heat sink fins. In a further embodiment, the micro plasma actuators may couple with a micro channel heat sink or a porous heat sink.

In one embodiment, a feedback control system may be used inside the electronic system. The temperature sensors may couple with the heat source and plasma actuators. An IC assembly may read the temperature data and based on the data to power and control the plasma gas flow rate of each actuator.

In one embodiment, each plasma actuator in the plasma actuator assembly may be separately controlled and powered, such as, by a controller and a power supplier, to provide different convective cooling rates at different locations on the heat sink fins.

In one embodiment, varied voltages may be applied to the electrodes to induce the gas flow to cool down the heat source. The applied voltages may have varied waveforms, frequencies, amplitude, phase shifts, and time period.

BRIEF DESCRIPTION OF THE DRAWINGS

A better understanding of the present invention may be obtained when the following detailed description is considered in conjunction with the following drawings, in which.

Figure 1:
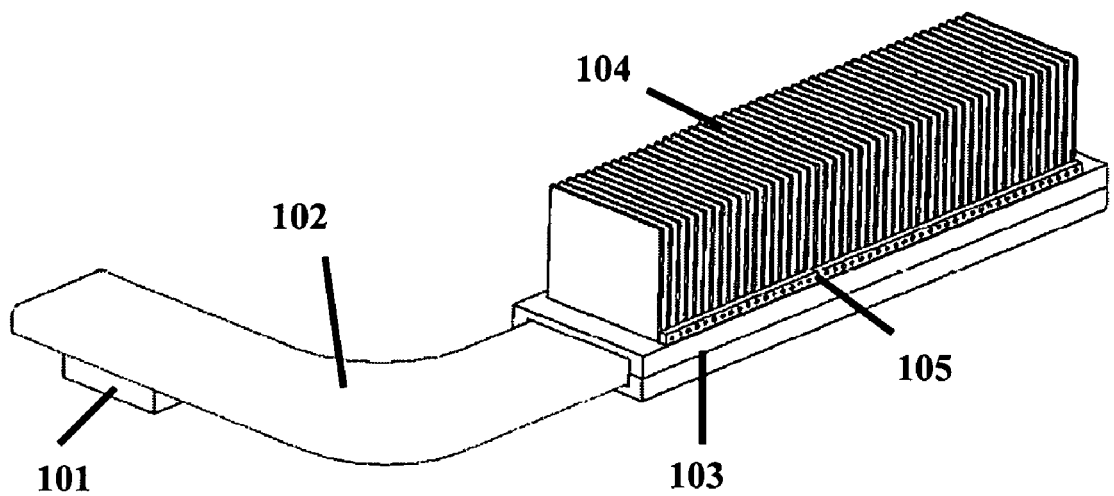
FIG. 1 illustrates a plasma-driven cooling device coupled to the heat sink fins assembly, heat sink base, heat transferring pipes, and heat source, according to an embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION OF THE INVENTION

The invention generally relates to apparatus for cooling microelectronic devices or packages, such as microprocessors, and ASIC. Such systems and methods may be used in a variety of applications. A non-exhaustive list of such applications includes the cooling of: a microprocessor chip, a graphics processor chip, an ASIC chip, a video processor chip, a DSP chip, a memory chip, a hard disk drive, a graphic card, a portable testing electronics, a personal computer system.

Take laptop computer for example, conventional fans use a lot of space and energy. For this reason, the plasma-driven cooling device represents a way to increase their cooling capacity and make them more reliable and far quieter. Therefore the higher-performance chips that generate too much heat for current laptops can be used.

As used herein "plasma" is an ionized gas, a gas into which sufficient energy is provided to free electrons from atoms or molecules and to allow both species, ions and electrons, to coexist. Plasma is even common here on earth. A plasma is a gas that has been energized to the point that some of the electrons break free from, but travel with, their nucleus. Gases can become plasmas in several ways, but all include pumping the gas with energy. A spark in a gas will create a plasma. A hot gas passing through a big spark will turn the gas stream into a plasma that can be useful. Plasma torches like that are used in industry to cut metals.

As used herein "electrode" is an electrical conductor used to make contact with a metallic part of a circuit.

As used herein "dielectric piece" is a substance that is a poor conductor of electricity, but an efficient supporter of electrostatic fields. In practice, most dielectric materials are solid. An important property of a dielectric is its ability to support an electrostatic field while dissipating minimal energy in the form of heat. The lower the dielectric loss (the proportion of energy lost as heat), the more effective is a dielectric material. Another consideration is the dielectric constant, the extent to which a substance concentrates the electrostatic lines of flux. Substances with a low dielectric constant include a perfect vacuum, dry air, and most pure, dry gases such as helium and nitrogen. Materials with moderate dielectric constants include ceramics, distilled water, paper, mica, polyethylene, and glass. Metal oxides, in general, have high dielectric constants.

FIG. 1 illustrates a configuration of an electronic cooling device. Heat source 101 generates heat and the heat is transferred to the heat sink fin assembly 104, through heat transfer pipes 102, and heat sink base 103. The heat source 101, heat transferring pipes 102, heat sink base 103, and heat sink fins assembly 104 are coupled together. The heat transfer pipes 102 may be heat pipes, liquid cooling pipes, refrigeration pipes, and other heat transferring pipes.

Figure 2:
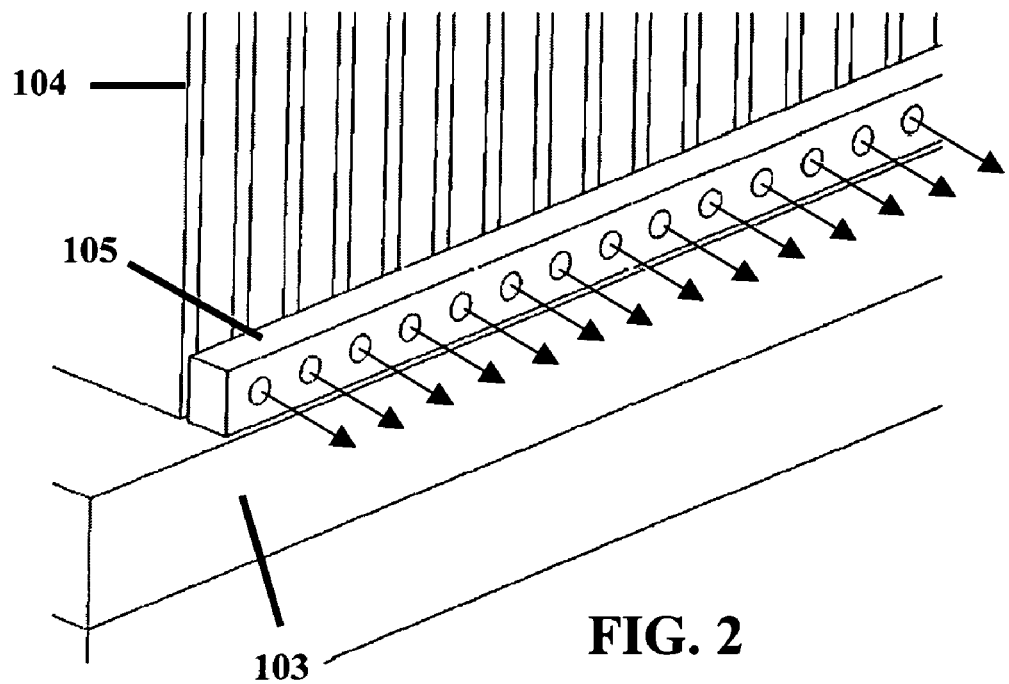
FIG. 2 illustrates an array of micro plasma driven cooling devices coupled to the heat sink fins assembly, according to an embodiment.

FIG. 2 is a closer look of the system and it illustrates an array of micro plasma actuators is coupled to heat sink fins assembly 104. For the configuration, the micro plasma actuators will induce the air flowing out of heat sink fins assembly 104, and therefore the cooling is achieved.

Figure 3:
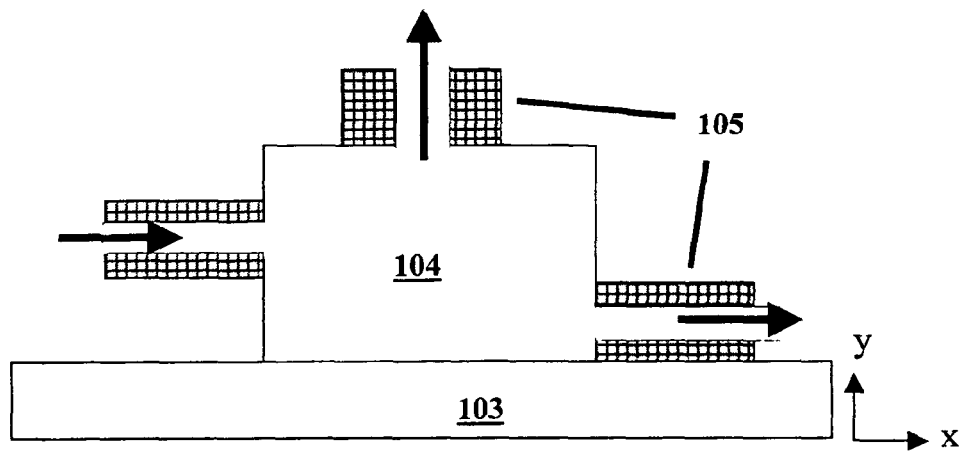
FIG. 3 illustrates micro plasma actuators are attached to heat sink fins assembly at different locations, according to an embodiment.

FIG. 3 illustrates that the micro plasma actuators may be coupled to heat sink fins assembly 104 at varied locations. The micro plasma actuators may be populated in an array or may be assigned at specific location for the cooling.

Figure 4:
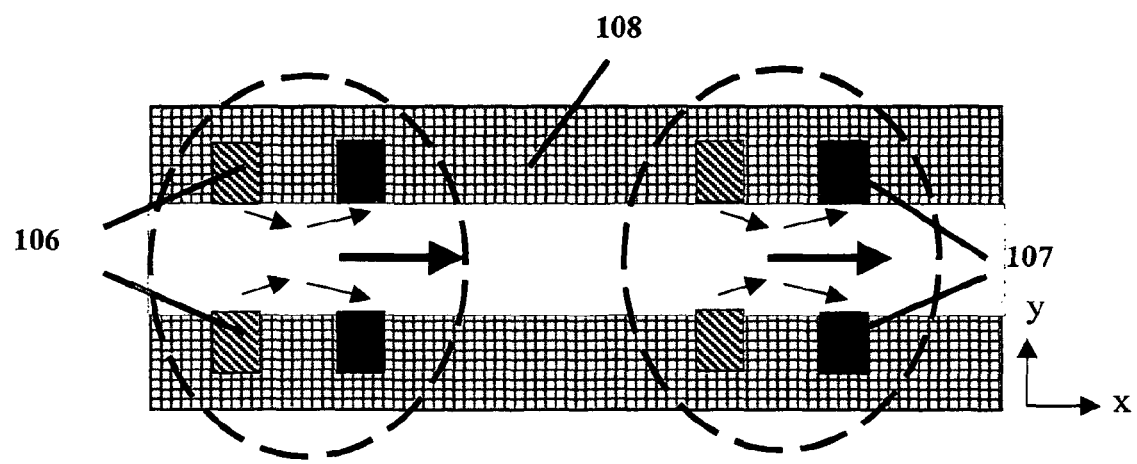
FIG. 4 illustrates the detailed view of a micro plasma actuator assembly, according to an embodiment.
Figure 5:
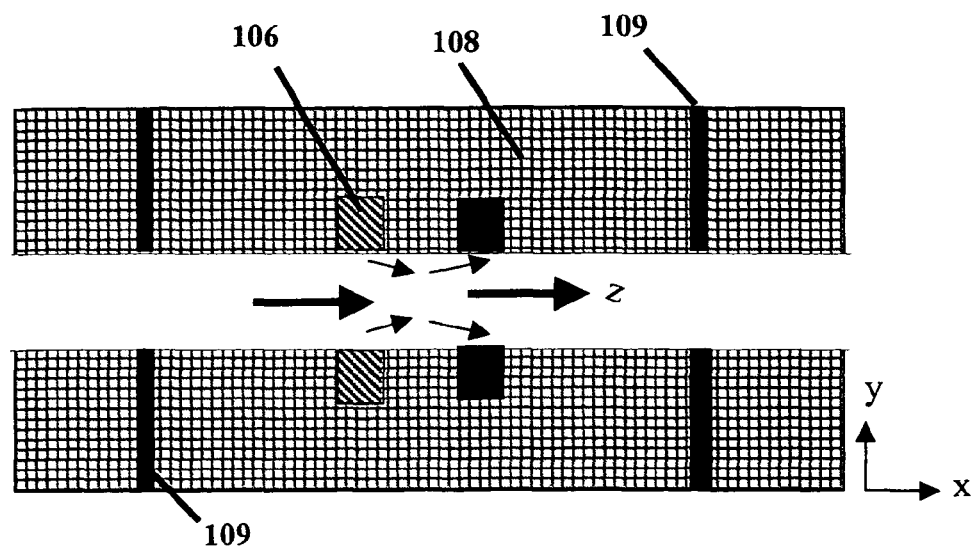
FIG. 5 illustrates the configuration of the electrodes on micro plasma actuators, according to an embodiment.

FIG. 4 illustrates a cross sectional view of the micro plasma actuators. For this configuration, when appropriate voltages are applied to the anode 106 and cathode 107, the plasma flow, as the arrows shown in the figure, is induced. The figure shows that there are two pairs of micro plasma actuators. For practical application, one single pair or multiple pairs of plasma actuators may be used. FIG. 5 shows one pair of micro plasma actuator is embedded inside the dielectric material and two shielding metallization layers are enclosing the actuator. For some electronic devices, the prevention of the EMI and EMC interference may be important. In one embodiment, the shielding metallization layer will diminish the EMI/EMC interference, from micro plasma actuators to other components of the electronic devices.

Figure 6:
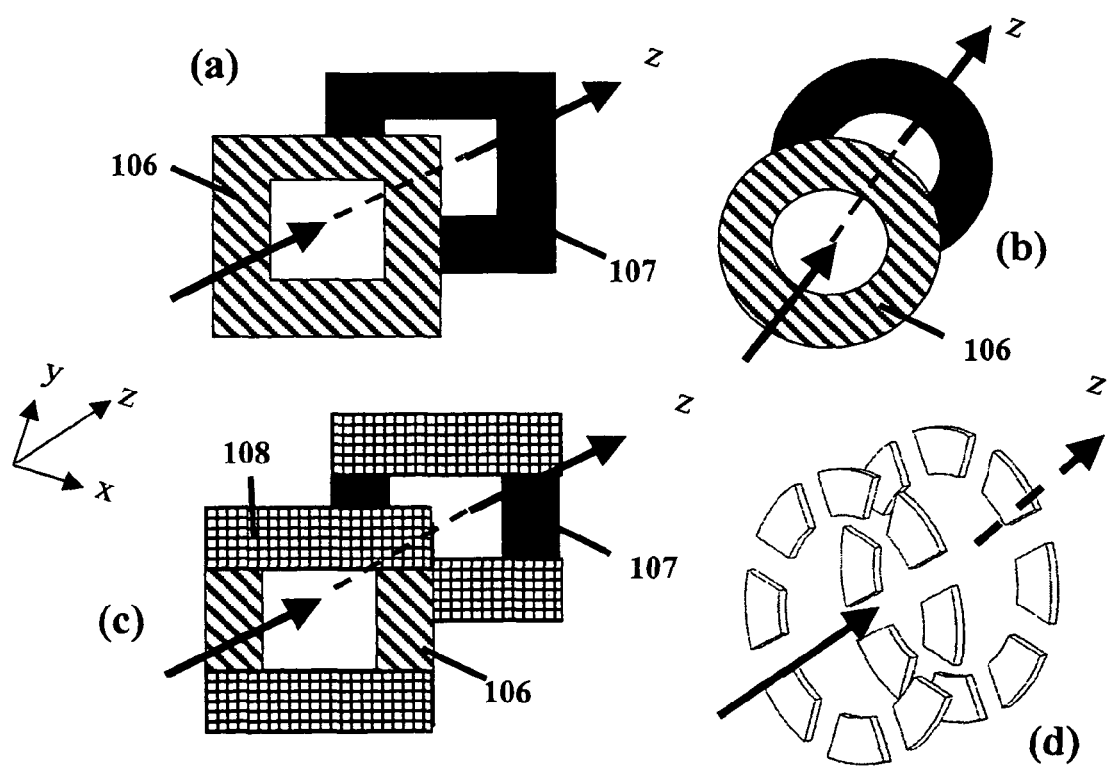
FIG. 6 illustrates configurations of micro plasma actuators, according to an embodiment.

FIG. 6 illustrates that the electrodes of anode 106 and cathode 107, can be a square shape as shown in FIG. 6a, or a circular shape as shown in FIG. 6b, and the electrode can be non-continuous as shown in FIG. 6c and FIG. 6d, which have many segments. The plasma induced plasma gas flow is going through the passage hole in the middle of the electrode, as the arrow shown, in z direction, in the figures. In one embodiment, the shape and geometry of the electrodes may be varied and shall be considered within the scope of the invention here. The shape, for example, may contain sharp needle configuration to enhance the plasma flow due to the sharp needle geometry will have higher electric field.

Figure 7:
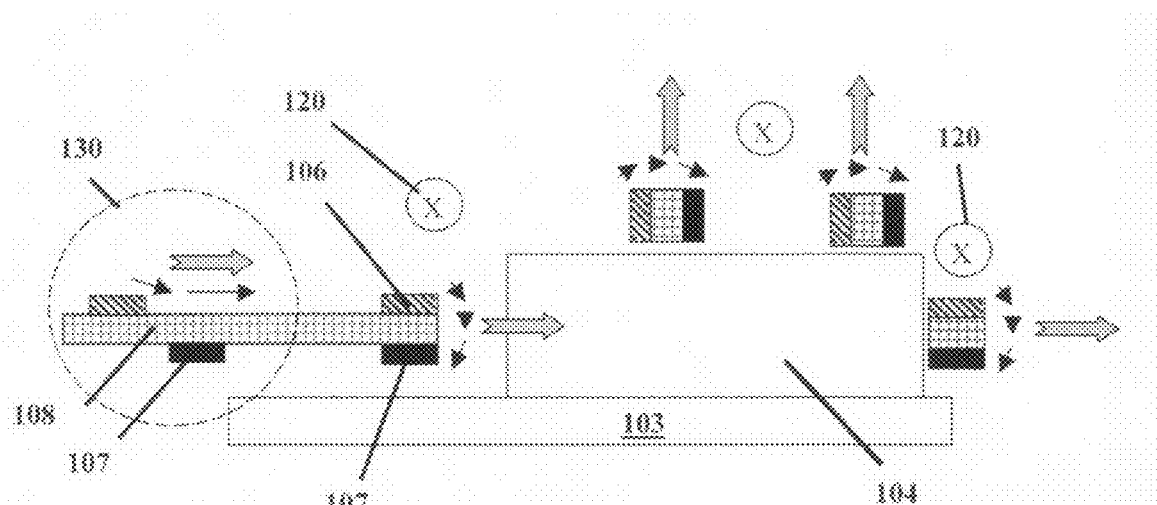
FIG. 7 illustrates micro plasma actuators are coupled to heat sink fins assembly, according to an embodiment.

For FIG. 1 to FIG. 6, the plasma gas flow is flowing through the passage, which is in the middle of the electrodes. In a different configuration, the micro plasma actuators may have electrodes on the two sides of the dielectric layers and couple with a magnetic field to induce the plasma gas flow. FIG. 7 shows one example of such a configuration. The figure shows electrodes are on two sides and at the edge of the dielectric layer. The plasma gas is flowing between top and bottom electrodes in a direction as the shown small arrows. The shown big arrows are the plasma gas flowing for cooling down the heat sink fins assembly. A magnetic field 120 may be provided in a direction going into the paper. In one embodiment, the micro plasma actuators may couple to the heat sink at different locations, such as, at front inlet, at top, or at rear outlet of the heat sink fins assembly. In another embodiment, the current micro plasma actuators may couple to plasma actuators, which utilize the actuation mechanism of dielectric barrier discharge 130.

Figure 8:
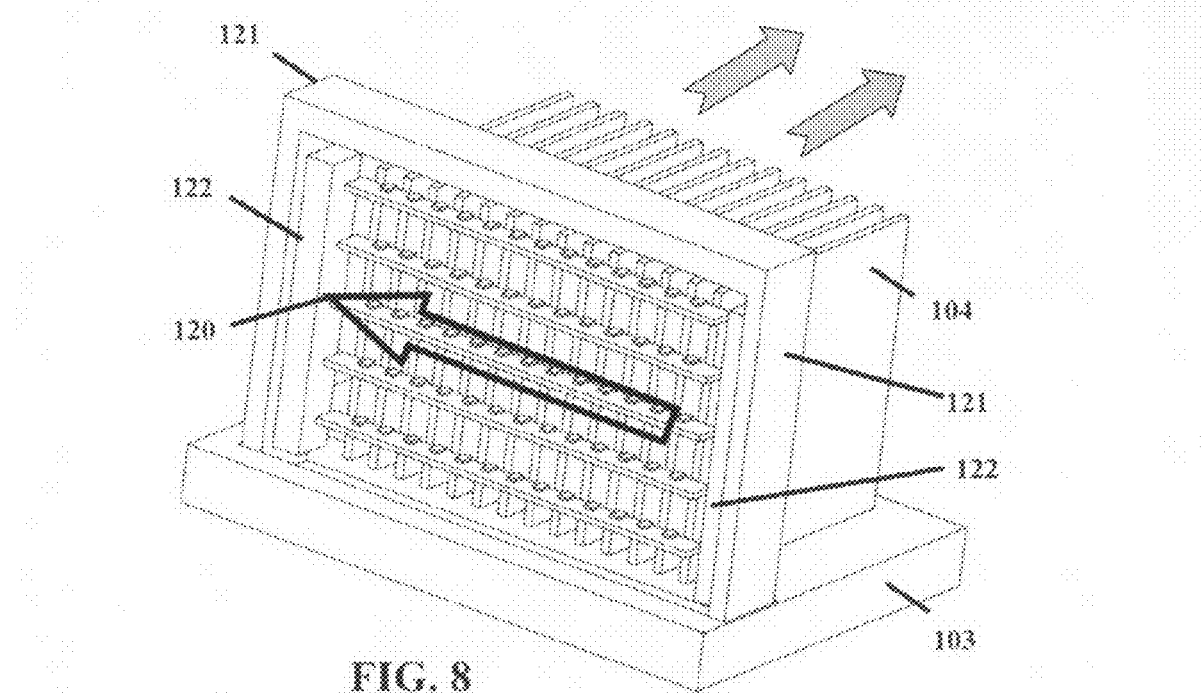
FIG. 8 illustrates several array of micro plasma actuators coupled to a heat sink fins assembly and a magnetic circuit assembly, according to an embodiment.
Figure 9:
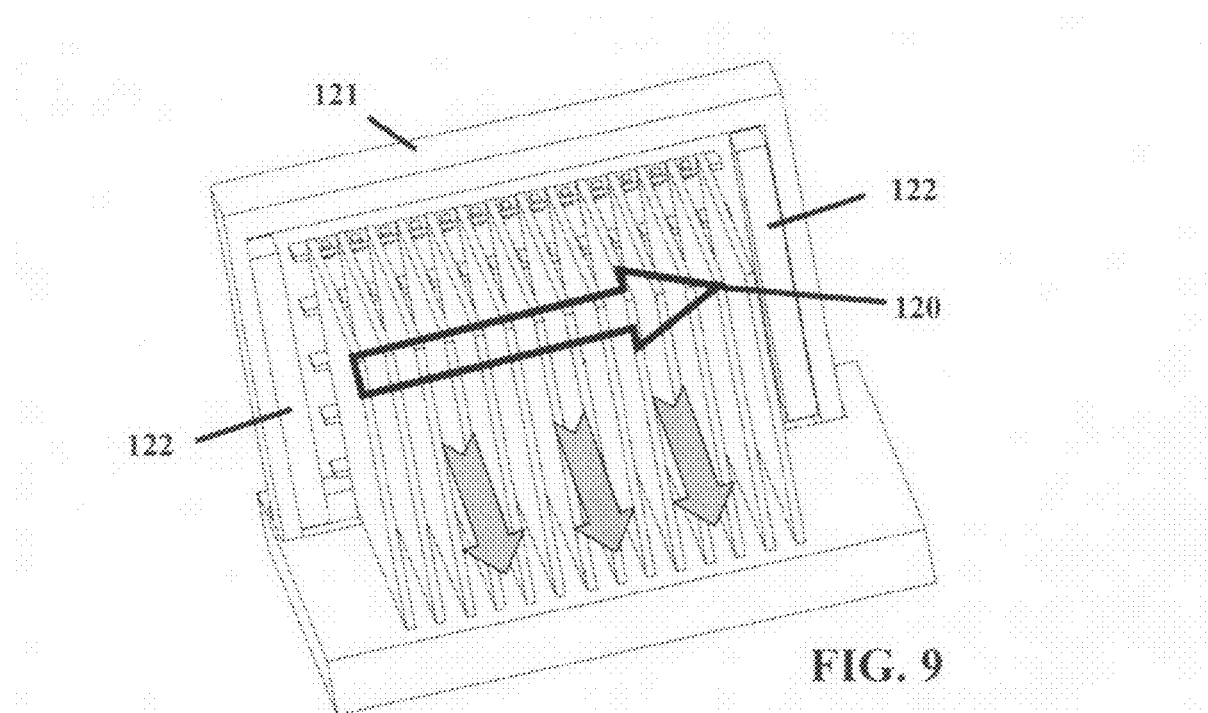
FIG. 9 illustrates several array of micro plasma actuators coupled to a heat sink fins assembly and a magnetic circuit assembly, according to an embodiment.
Figure 10:
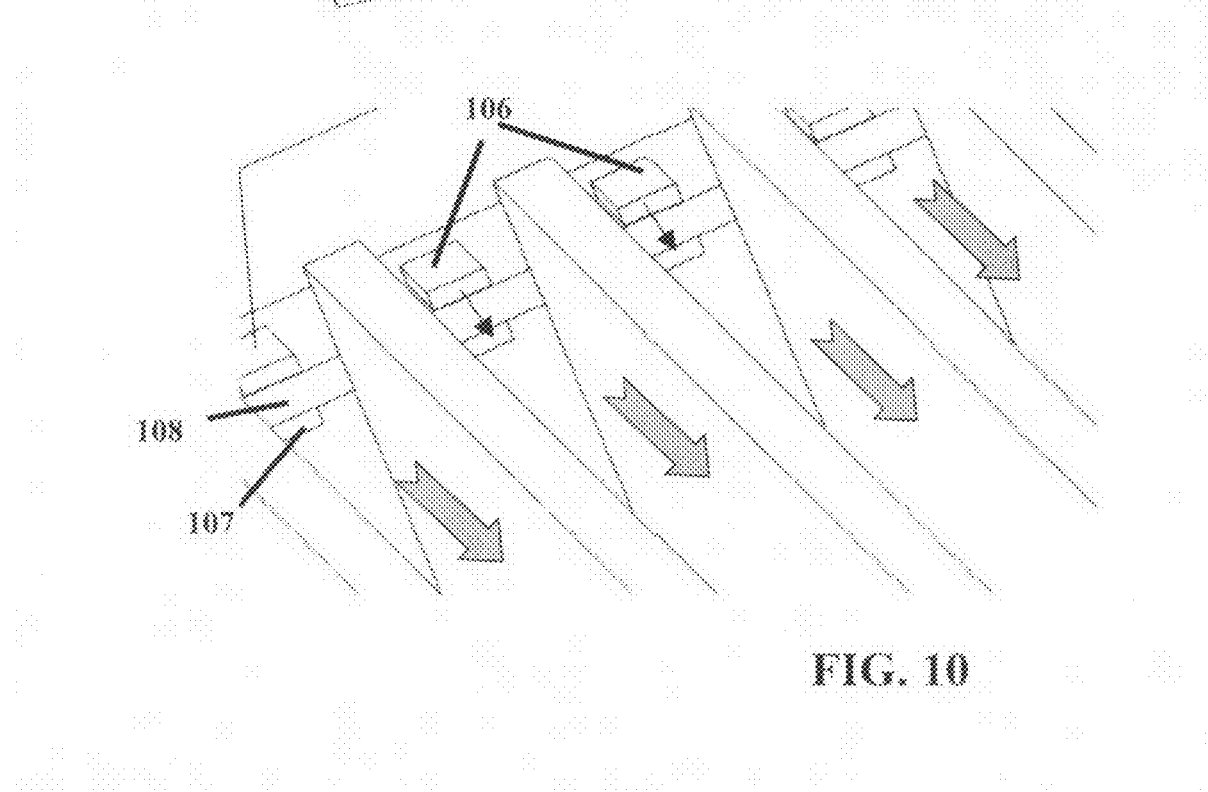
FIG. 10 illustrates several array of micro plasma actuators coupled to a heat sink fins assembly and a magnetic circuit assembly, according to an embodiment.

FIG. 8 and FIG. 9 illustrate one example of arrays of micro plasma actuators coupled to heat sink fins assembly 104. The micro plasma actuators assembly in this example is coupled to the heat sink assembly on one side. The magnetic field 120 may be provided by a pair of magnets 122. The magnets are facing each other and a ferromagnetic yoke 121 may couple to the magnets 122 to increase the magnetic field strength between two magnets. FIG. 10 is the detailed view of the micro plasma actuators.

Figure 11:
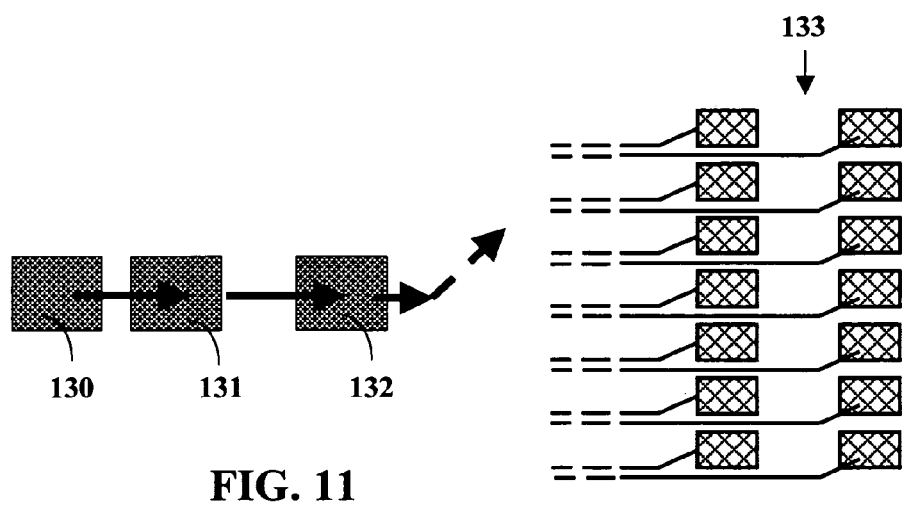
FIG. 11 illustrates the actuation mechanism of the micro plasma actuators.

FIG. 11 illustrates an example of activating the micro plasma actuators for cooling an electronic system. The electronic system may contain a power supplier 130, an amplifier 131, a channel switching device 132, and micro plasma actuators array 133. The entire micro plasma actuators array may be activated altogether, or a few actuators may be actuated together, or all each actuator may be activated individually. Very short voltage pulses may excite each plasma actuator. The power supplier 130 provide the power signal and the signal is amplified by an amplifier 131 to the required amplitude of the voltage and current. A switching device 132 may be used to determine which actuator to be excited. The frequency and timing of actuation for each actuator may be adjusted and therefore the cooling rate at different location will be adjusted accordingly. In one embodiment, a single or many power suppliers may power all actuators. The power suppliers and switching devices may switch and sweep the electrical power to different actuators in high speed. In another embodiment, the sequence of using amplifier 131 and switching device 132 may be varied and both devices are optional.

Figure 12:
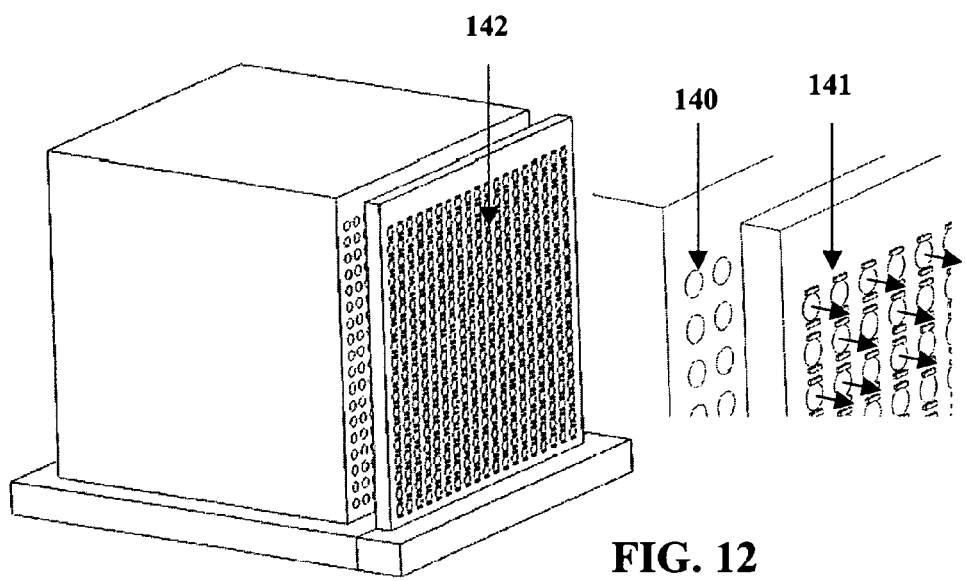
FIG. 12 illustrates the micro plasma actuators are coupled to micro heat sink.

The advantage of micro channel heat sink is that the total surface area of heat sink fins is greatly increased and therefore the cooling efficiency is increased. One embodiment of the design is that the heat sink fins may be made in a form of micro porous media 140 which has larger surface area. The heat sink fins may be made of, such as carbon nanotube, as shown in FIG. 12, or in a form of straight micro heat sink fins as shown in FIGS. 8, 9, and 10. When the pitch of the heat sink fins and the scale of the porous passage become very small, such as in a scale of micro or nano meters, the air becomes very difficult to flow in and flow out. In another embodiment, the micro channel heat sink fins or porous heat sink fins may couple to the micro plasma actuators 141 as shown in FIG. 12. The micro plasma actuators array 142 may be used to cool down the micro channel heat sink fins or porous heat sink fins. In a further embodiment, the small pitch heat sink fins, the porous heat sink, and the plasma actuators may be made with micro or nano meter scale.

Figure 13:
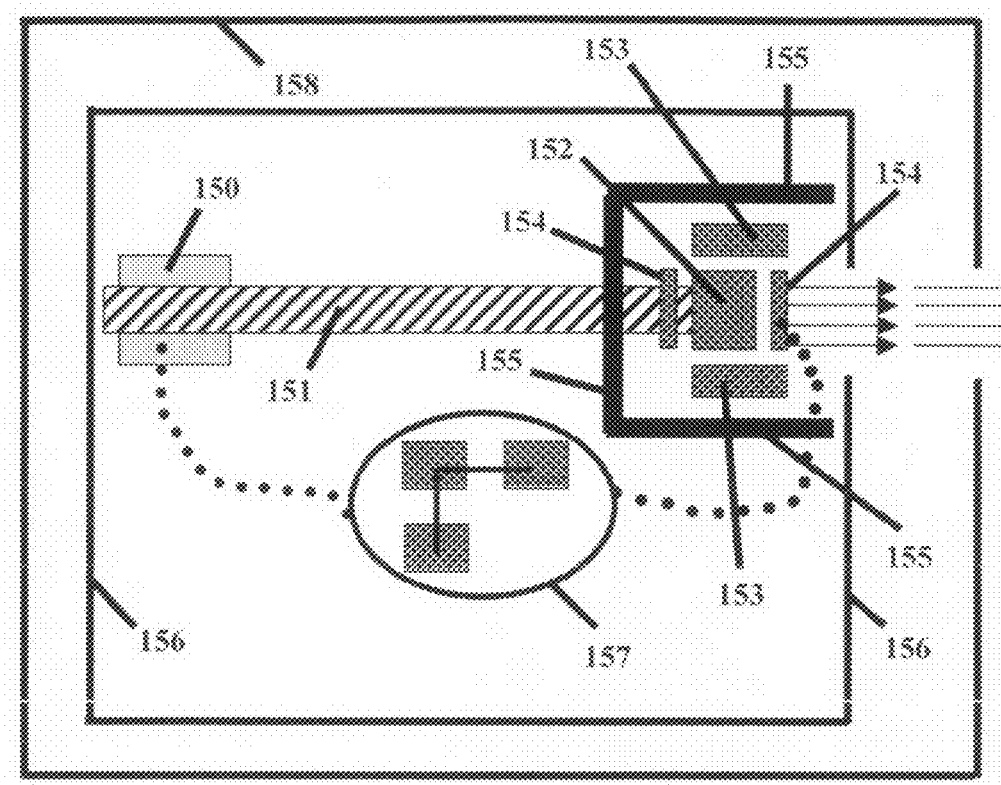
FIG. 13 illustrates the application of micro plasma actuators to cool down an electronic device.

FIG. 13 illustrates one application of the invention here. A printed circuit board 156 is inside an electronic device 158. One or more heat sources 150 may couple to the printed circuit board 156. A heat transfer pipe 151 may couple to the heat source 150 to transfer the heat from heat source 150 to micro heat sink fins assembly 152. One or more micro plasma actuators 154 may couple to heat sink fins assembly 152 to pump the air gas into or pump the air gas out from the micro heat sink fins assembly 152. A magnetic circuit assembly 153 may couple to the micro plasma actuators to excite the moving of the plasma gas flow. The magnetic circuit assembly 153 may be composed by permanent magnets or electromagnets. In order to prevent the electrical interference, a shielding device 155, such as the electrically conductive metals or ferromagnetic metals, may partially or fully enclose the micro heat sink fins 152, micro plasma actuators 154, and magnetic circuit assembly 153. To actuate the micro plasma actuators, an IC assembly 157 may couple to printed circuit board 156, heat source 150, heat sink fins 152, and micro plasma actuators 154. The IC assembly may contain an ASIC, a microcontroller, a power supplier system, a power amplifier, a switching device, and other semiconductor chips. In one embodiment, the temperature of the heat source can be controlled by a feedback control system. The temperature sensors may couple to the heat source 150 and micro heat sink fins assembly 152. The IC assembly may read the temperature data on the heat source, and based on the temperature data, the IC assembly 157 may command the micro plasma actuators 154 to increase or decrease the plasma flow rate. The dot lines in the figure illustrate possible signal and power transmission for the feedback control of the temperature. The arrows shown in the figure are the plasma gas flow. In another embodiment, the micro plasma actuators 154 may locate near the outside boundary of the electronic device 158 in order to dissipate the heat to outside ambient.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An apparatus for cooling an electronic device, comprising:
   a heat sink fin assembly comprises a plurality of heat sink fins;
   a plurality of electrode pairs each constitutes an ion actuator wherein each electrode pair comprises two electrodes of opposite electric polarities disposed adjacent to each other on said plurality of heat sink fins; and
   each of said electrode pairs is configured with the two electrodes of opposite electric polarities disposed on two opposite sides of a channel between said plurality of heat sink fins for passing and ionizing a gas flow therethrough into an ionized gas flow.

2. The cooling apparatus of claim 1 wherein:
   said ion actuator is further connected with a magnetic circuit assembly to induce the ionized gas flow.

3. The cooling apparatus of claim 1 wherein:
   each of the electrode pairs is configured as a ring-shaped electrode pair for surrounding the channel for passing and ionizing the gas flow therethrough.

4. The cooling apparatus of claim 1 wherein:
   each of the electrode pairs is configured as a square-shaped or rectangular-shaped electrode pair for surrounding the channel for passing and ionizing the gas flow therethrough.

5. The cooling apparatus of claim 1 wherein:
each of the electrode pairs is configured as a segmented ring-shaped electrode pair for surrounding the channel for passing and ionizing the gas flow therethrough.

6. The cooling apparatus of claim 2 wherein:
each of the ion actuators further comprises a dielectric layer to support the electrodes thereon.

7. The cooling apparatus of claim 1 wherein:
the electrode pairs are disposed with a fixed distance between said two electrodes of opposite polarities disposed adjacent to each other on said heat sink fins.

8. The cooling apparatus of claim 1 wherein:
the electrode pairs, each constituting as the ion actuator are disposed on the two opposite sides of the channel between the heat sink fins are padded with a dielectric layer and said ion actuator is coupled to a magnet to drive the ionized gas flow through the channel.

9. The cooling apparatus of claim 1 wherein:
at least one of the electrode pairs, each constituting as the ion actuator is disposed at an entrance of the cooling apparatus and at least one of the electrode pairs, each constituting as the ion actuator is disposed at an exit of the apparatus.

10. The cooling apparatus of claim 1 further comprising:
a fan to enhance the ionized gas flow to pass through the cooling apparatus.

11. The cooling apparatus of claim 1 wherein:
the heat sink fin assembly having straight fins or pin fins for disposing said pairs of electrodes thereon.

12. The cooling apparatus of claim 1 wherein:
the heat sink fins are padded with a dielectric layer and the electrodes are embedded inside the dielectric layer to configure a part of the channel inside the dielectric layer as a passage for passing the ionized gas flow.

13. The cooling apparatus of claim 1 further comprising:
metal shielding layers disposed in said heat sink fins to shield and insulate the ion actuators.

14. The cooling apparatus of claim 1 further comprising:
a switch controller to control and activate each of and also simultaneously a group of said micro ion actuators to control the cooling rate of the cooling apparatus.

15. The cooling apparatus of claim 1 further comprising:
a power supply controller to control a voltage applied to each and a group of the ion actuators with varied voltages, varied waveform, and the voltages may be pulse, steady, or transient voltages.

16. The cooling apparatus of claim 1 further comprising:
a power amplifier to control a power supplied to the cooling apparatus for controlling a cooling rate of the cooling apparatus.

17. The cooling apparatus of claim 1 wherein
the ion actuators further comprise carbon nanotubes configured in a bulk scale, a micro meter scale, or a nano meter scale.

18. The cooling apparatus of claim 1 wherein:
the heat sink fins are further composed of a micro porous material.

19. The cooling apparatus of claim 1 further comprises:
a feedback controlling system comprises integrate circuits (ICs), sensors, amplifiers, power suppliers, and switching devices to control the cooling rate of the ion actuators.

20. The cooling apparatus of claim 1 further comprising:
a carrier board for supporting the cooling apparatus with a cooling pipe connected to the electronic device as heat source for applying a control and feedback circuit system supported on the carrier board to cool the electronic device.

* * * * *